United States Patent
Toyoda et al.

(10) Patent No.: US 7,525,081 B2
(45) Date of Patent: *Apr. 28, 2009

(54) COMPOUND-EYE IMAGING DEVICE HAVING A LIGHT SHIELDING BLOCK WITH A STACK OF MULTIPLE FLAT UNIT PLATES

(75) Inventors: Takashi Toyoda, Daito (JP); Yoshizumi Nakao, Daito (JP); Yasuo Masaki, Daito (JP)

(73) Assignee: Funai Electric Co., Ltd., Daito-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/645,700

(22) Filed: Dec. 27, 2006

(65) Prior Publication Data

US 2007/0145242 A1 Jun. 28, 2007

(30) Foreign Application Priority Data

Dec. 27, 2005 (JP) ............................. 2005-373998

(51) Int. Cl.
*H01L 27/00* (2006.01)
(52) U.S. Cl. .................................... 250/208.1; 250/239
(58) Field of Classification Search ............. 250/208.1, 250/239, 216, 226; 348/59, 42, 50; 396/326, 396/324, 377; 257/290–292, 440
See application file for complete search history.

(56) References Cited

U.S. PATENT DOCUMENTS 4,663,738 A * 5/1987 Sprague et al. ............. 365/127
4,732,453 A * 3/1988 de Montebello et al. .... 359/619

FOREIGN PATENT DOCUMENTS

| JP | 3033242 B2 | 11/1992 |
| JP | 2001-230401 A | 8/2001 |
| JP | 2004-336228 A | 11/2004 |

* cited by examiner

*Primary Examiner*—Que T Le
(74) *Attorney, Agent, or Firm*—Crowell & Moring LLP

(57) ABSTRACT

A compound-eye imaging device comprises: an optical lens array with integrated multiple optical lenses; a photodetector array for imaging images formed by the optical lenses; and a light shielding block placed between the two arrays for partitioning a space between the two arrays into a matrix of spaces as seen on a plane perpendicular to the optical axis of each optical lens so as to prevent lights emitted from the optical lenses from interfering each other. The light shielding block is formed of flat unit plates of two kinds having different thicknesses and stacked between the optical lens array and the photodetector array. Since the light shielding block is formed of stacked flat unit plates, it is easy to manufacture a light shielding block having apertures with dense structure having a small distance between adjacent apertures, and also easy to adapt to variations in focal length of the optical lenses.

12 Claims, 6 Drawing Sheets

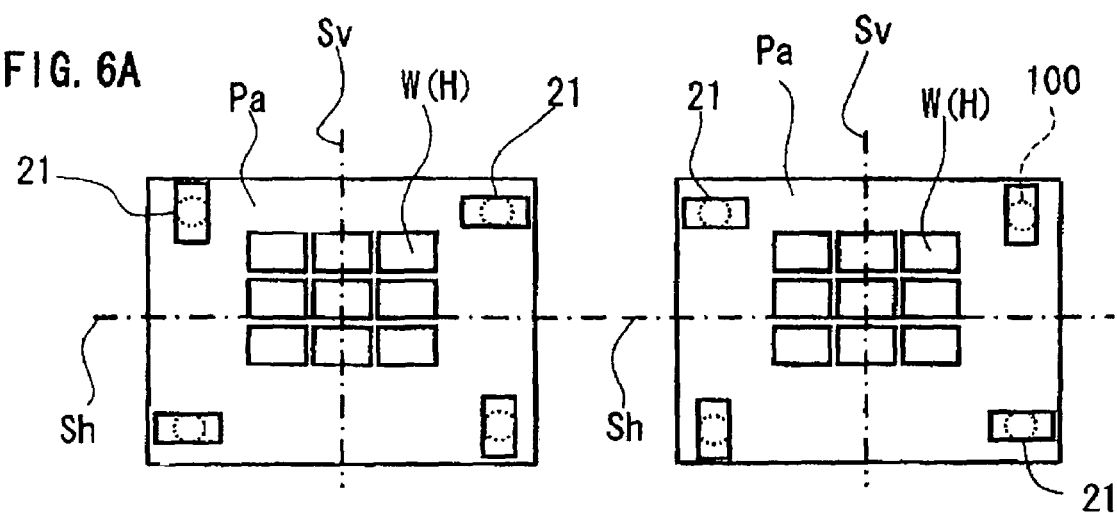
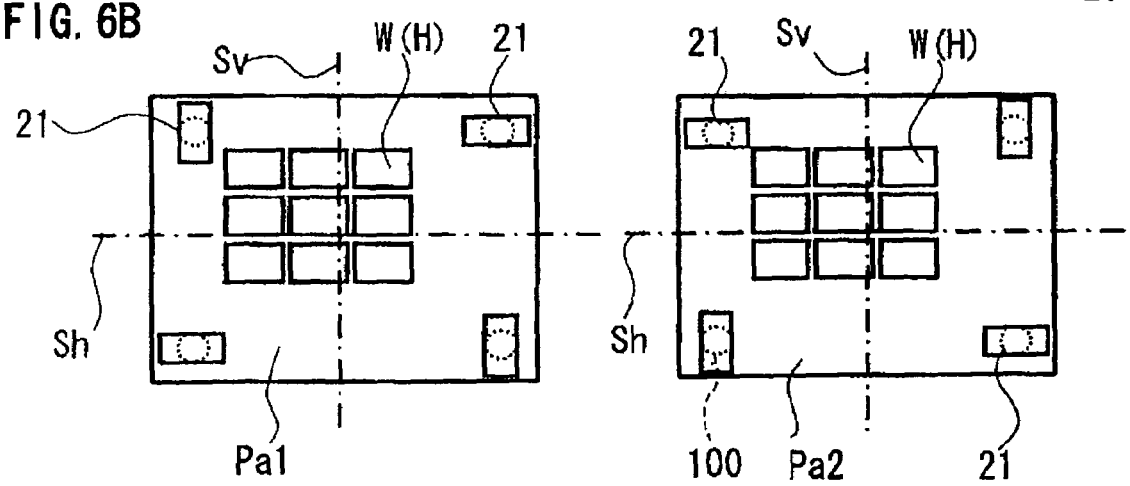

COMPOUND-EYE IMAGING DEVICE HAVING A LIGHT SHIELDING BLOCK WITH A STACK OF MULTIPLE FLAT UNIT PLATES

BACKGROUND OF THE INVENTION

1. Field of the Invention

The present invention relates to a compound-eye imaging device having an optical imaging system which is formed of multiple micro optical systems so as to reduce the focal length, making it possible to reduce the thickness of the compound-eye imaging device.

2. Description of the Related Art

There has been developed a compound-eye imaging device as a thin camera module to be installed in a cellular phone, a personal computer, or the like. The compound-eye imaging device is mainly composed of: an optical lens array with multiple integrated optical lenses; a photodetector array for imaging multiple images formed by the respective optical lenses of the optical lens array; and an image reconstructing circuit for reconstructing the multiple images, imaged by the photodetector array, into one image by using parallax information between the multiple images.

It is known to form a lens array unit by placing a light shielding block between the optical lens array and the photodetector array for partitioning a space between the optical lens array and the photodetector array into a matrix of spaces as seen on a plane perpendicular to the optical axis of each optical lens so as to prevent lights emitted from the optical lenses from interfering each other (refer to e.g. Japanese Laid-open Patent Publication 2004-336228). Besides, other than the compound-eye imaging devices, a solid state imaging device is known in which multiple resin layers are provided between a lens array and a photoelectric conversion area (photodetector array), such that the refractive indices of the resin layers sequentially decrease from the lowermost layer to the uppermost layer so as to increase the light condensing rate of light which enters lenses of the lens array and is condensed onto the photoelectric conversion area (refer to e.g. Japanese Laid-open Patent Publication Hei 4-343470). Also known is a solid state imaging device in which a step is formed between a semiconductor substrate surface around a photoelectric conversion element and a light incident surface on the surface of the photoelectric conversion element so as to prevent scattered light from entering a peripheral surface of the photoelectric conversion element (refer to e.g. Japanese Laid-open Patent Publication 2001-230401).

A compound-eye imaging device generally has a light shielding block as described in the above-mentioned Japanese Laid-open Patent Publication 2004-336228, which has partition walls to partition a space between a photodetector array and an optical lens array with multiple optical lenses so that lights emitted from the optical lenses of the optical lens array to the photodetector array are prevented from interfering each other. The light shielding block is formed of a plate-like or flat plate material having a predetermined thickness and having formed therein multiple apertures (through-holes) which face the respective optical lenses. Conventionally, laser processing is used to form such apertures in a metal plate. Otherwise, in some cases, a plate-like or flat plate material formed by a photo-curable resin may be used for the light shielding block.

Each aperture of the light shielding block is likely to have a greater depth (i.e., each through-hole corresponding to the aperture has a greater length in the thickness direction of the light shielding block) relative to the area of the aperture as the integration density of the optical lenses increases. That is, the through-hole to be formed is likely to have an elongated shape. Furthermore, in order to effectively utilize the area of the compound-eye imaging device in the plane direction (horizontal direction), it is preferred that adjacent apertures be closer to each other. Thus, the through-hole of each aperture is likely to be formed as long as possible, while the partition wall between adjacent apertures is likely to be formed as thin as possible.

However, an attempt to use the laser processing to form apertures in a dense structure as described above causes problems such as a difficulty in obtaining required dimensional accuracy and an increase in processing cost. In addition, actually, there are slight variations in focal length of the optical lenses among the respective optical lens arrays or product lots. Nonetheless, conventionally, light shielding blocks with the same structure (same dimensions) are used without considering such variations at all. In other words, conventionally, light shielding blocks with the same structure are used for assembly, considering that slight variations in focal length of the optical lenses among the optical lens arrays or product lots are negligible. Thus, there is a risk that images reproduced by a compound-eye imaging device completed as a final product may be insufficient in sharpness. A possible solution for the problem may be to prepare a material adjusted in thickness for each optical lens array, and to subject the material to the laser processing so as to manufacture the light shielding block. However, this significantly increases the manufacturing cost of each compound-eye imaging device,

SUMMARY OF THE INVENTION

An object of the present invention is to provide a compound-eye imaging device which makes it possible to easily manufacture a light shielding block having apertures with a dense structure having e.g. a small distance between adjacent apertures, and which can easily adapt to variations in focal length of the optical lenses, making it possible to obtain reproduced images with high sharpness.

According to the present invention, this object is achieved by a compound-eye imaging device comprising: an optical lens array with multiple integrated optical lenses; a photodetector array placed at a predetermined distance from the optical lens array for imaging images formed by the optical lenses, respectively, and a light shielding block placed between the optical lens array and the photodetector array for partitioning a space between the optical lens array and the photodetector array into a matrix of spaces as seen on a plane perpendicular to the optical axis of each optical lens to prevent lights emitted from the optical lenses from interfering each other. The light shielding block is formed of multiple flat unit plates stacked between the optical lens array and the photodetector array.

The compound-eye imaging device according to the present invention has a light shielding block formed of stacked multiple flat unit plates so that the compound-eye imaging device makes it possible to easily manufacture a light shielding block having apertures with a dense structure having e.g. a small distance between adjacent apertures, and can easily adapt to variations in focal length of the optical lenses, making it possible to obtain reproduced images with high sharpness.

Preferably, the multiple unit plates to form the light shielding block comprise at least two kinds of unit plates having different thicknesses. This makes it possible to more easily adapt to the variations in focal length of the optical lenses.

Further preferably, each of the stacked unit plates has notches at positions in sides thereof, wherein the positions in the sides of each of the stacked unit plates are staggered from those of each adjacent one of the stacked unit plates, and wherein an adhesive is filled in the notches of the stacked unit plates to bond the unit plates together. This makes it possible to more easily manufacture the light shielding block.

While the novel features of the present invention are set forth in the appended claims, the present invention will be better understood from the following detailed description taken in conjunction with the drawings.

BRIEF DESCRIPTION OF THE DRAWINGS

The present invention will be described hereinafter with reference to the annexed drawings. It is to be noted that all the drawings are shown for the purpose of illustrating the technical concept of the present invention or embodiments thereof, wherein:

FIG. 6A is a schematic plan view showing an upper surface, on the left, and a lower surface, on the right, of a unit plate usable to form a light shielding block of the compound-eye imaging device, and having windows provided symmetrically left and right as well as having rectangular holes for positioning pins to pass through;

FIG. 6B is a schematic plan view showing, on the left, an upper surface of a unit plate having windows provided asymmetrically left and right and also asymmetrically up and down as well as having rectangular holes for positioning pins to pass through, while also showing, on the right, an upper surface of a unit plate having windows provided asymmetrically left and right and also asymmetrically up and down as well as having rectangular holes for positioning pins to pass through;

FIG. 7A is a schematic plan view showing an upper surface, on the left, and a lower surface, on the right, of a unit plate usable to form a light shielding block of the compound-eye imaging device, and having windows provided symmetrically left and right as well as having two kinds of circular holes with two different diameters for positioning pins to pass through; and FIG. 7B is a schematic plan view showing, on the left, an upper surface of a unit plate having windows provided asymmetrically left and right and also asymmetrically up and down as well as having two kinds of circular holes with two different diameters for positioning pins to pass through, while showing, on the right, an upper surface of a unit plate having windows provided asymmetrically left and right and also asymmetrically up and down as well as having two kinds of circular holes with two different diameters for positioning pins to pass through.

DESCRIPTION OF THE PREFERRED EMBODIMENTS

Figure 1:
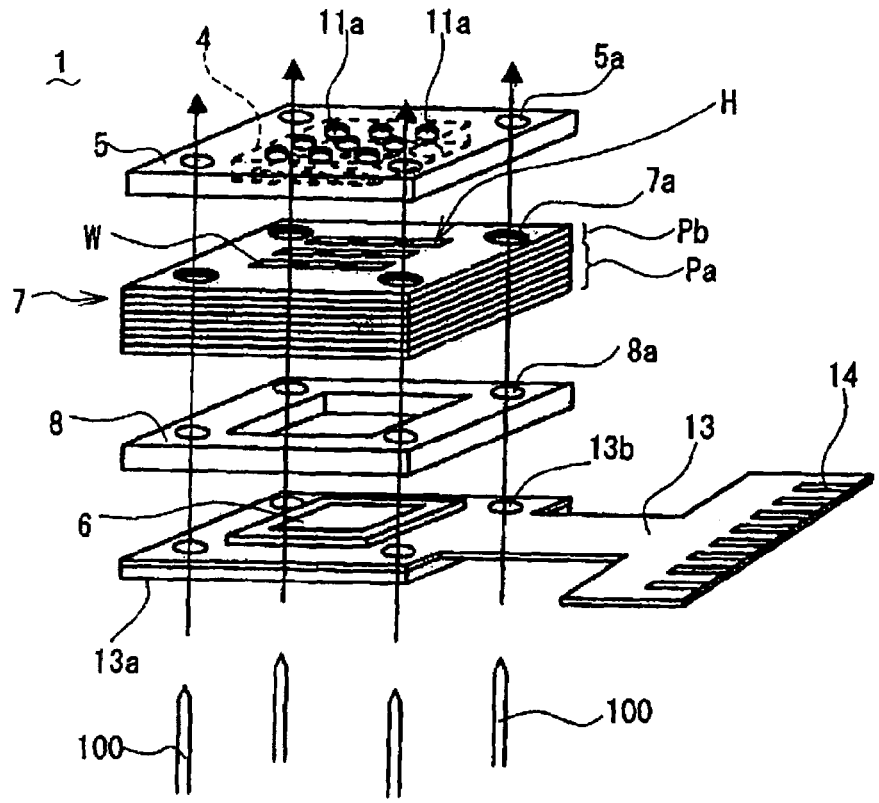
FIG. 1 is a schematic exploded perspective view of a compound-eye imaging device according to an embodiment of the present invention when assembling the same.

Embodiments of the present invention, as best mode for carrying out the invention, will be described hereinafter with reference to the drawings. The present invention relates to a compound-eye imaging device. It is to be understood that the embodiments described herein are not intended as limiting, or encompassing the entire scope of, the present invention. Note that like parts are designated by like reference numerals, characters or symbols throughout the drawings.

Figure 2:
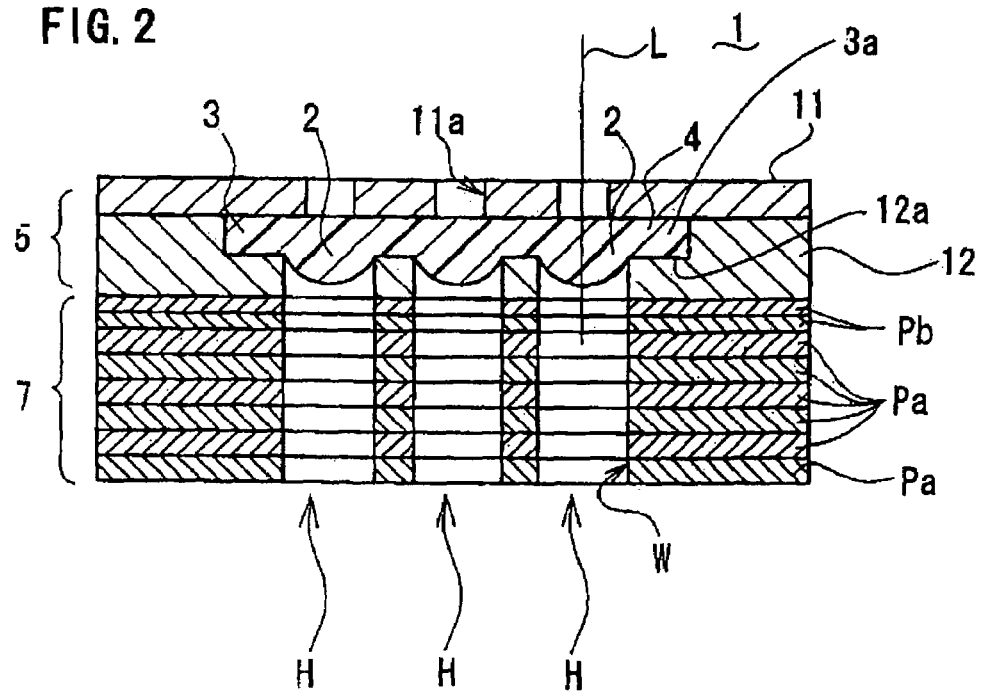
FIG. 2 is a schematic vertical cross-sectional view of a light shielding block and a lens holder for holding an optical lens array in the compound-eye imaging device.

FIG. 1 is a schematic exploded perspective view of a compound-eye imaging device 1 according to an embodiment of the present invention when assembling the same, while FIG. 2 is a schematic vertical cross-sectional view of a light shielding-block 7 and a lens holder 5 for holding an optical lens array 4 in the compound-eye imaging device 1. As shown in FIG. 1 and FIG. 2, the compound-eye imaging device 1 comprises: an optical lens array 4 having 9 (nine) optical lenses 2 which have optical axes L parallel to each other, and which are arranged in a matrix of three rows and three columns and integrally formed as single convex.lenses on a lower surface of one transparent substrate 3; and a lens holder 5 for vertically sandwiching and holding the optical lens array 4.

The compound-eye imaging device 1 further comprises: a photodetector array 6 which is placed below, and at a predetermined distance from, the optical lens array 4, and which images 9 (nine) images also arranged in a matrix of three rows and three columns formed by, and corresponding to, the 9 optical lenses 2; a light shielding block 7 which is placed between the optical lens array 4 and the photodetector array 6, and which has a partition wall for partitioning a space between the optical lens array 4 and the photodetector array 6 into a matrix (three rows and three columns) of spaces as seen on a plane perpendicular to the optical axis L so as to prevent lights emitted from the respective optical lenses 2 from interfering each other; and a spacer frame 8 which is placed between the light shielding block 7 and the photodetector array 6, and surrounds the photodetector array 6 so as to prevent the light shielding block 7 from contacting the photodetector array 6.

As shown in FIG. 2, the lens holder 5 is composed of an upper plate 11 and a lower frame 12 having grooves 12a formed in upper inner edges thereof, such that end portions 3a of the optical lens array 4 fit in the grooves 12a. The upper plate 11 has 9 (nine) stop apertures 11a having a predetermined size at 9 positions corresponding to the 9 optical lenses 2 so as to serve as a stop member for shielding unnecessary ambient light from entering the optical lenses 2. The photodetector array 6 shown in FIG. 1 is formed of a semiconductor substrate, and is, for example, a CCD (Charge Coupled Device) image sensor. The photodetector array 6 is mounted on a square portion 13a which is an end portion of a flexible board (circuit board) 13. The flexible board 13 has, at the other end portion thereof, terminals 14 of signals lines extending from the photodetector array (CCD) 6.

As shown in FIG. 1, the lens holder 5, the light shielding block 7, the spacer frame 8 and the square portion 13a of the flexible board 13 are formed in the same-sized square, and have circular through-holes 5a, 7a, 8a and 13b at four corners of each thereof for later-described positioning pins 100 to pass through, respectively. Furthermore, each of the light shielding block 7 and the spacer frame 8 has, in side surfaces thereof, recesses (notches) in which an adhesive is to be filled, as will be described later. In FIG. 1, drawing of these recesses or notches is omitted.

Next, the structure of the light shielding block 7 will be described in detail. The light shielding block 7 of the present embodiment is formed of 6 (six) stacked flat unit plates Pa each made of a metal sheet (metal plate) having a thickness of 120 µm, and 2 (two) stacked unit plates Pb each made of a metal sheet having a thickness of 80 µm. Thus, the light shielding block 7 is formed of the total 8 (eight) units plates Pa and Pb, which have the same shape in plan view, but which have different thicknesses, to have a total thickness of 880 µm. The compound-eye imaging device 1 is designed so that the optical length of each optical lens 2 is equal to the total length of the sum of the thickness of the light shielding block 7 and the thicknesses contributed by the spacer frame 8 surrounding the photodetector array 6 and the lens holder 5 of the optical lens array 4.

All the unit plates Pa and Pb have 9 (nine) windows W located at the same positions and having the same shape so as to form, when stacked, tubular apertures (through-holes) H to pass lights emitted from the optical lenses 2. The windows W in predetermined shapes of the unit plates Pa and Pb of the present embodiment are formed by subjecting metal plates such as iron plates to an etching process capable of fine processing so as to form through-holes which are then subjected to a blackening process. Note that the unit plates Pa and Pb can also be formed by other methods such as thin plate working and resin molding.

Since the unit plates Pa and Pb have two kinds of thicknesses, 120 µm and 80 µm, it is possible to change the entire thickness of the light shielding block 7 at a pitch of 40 µm by changing each number of the two kinds of unit plates Pa and Pb to be stacked. For example, if 5 (five) unit plates Pa of 120 µm and 3 (three) unit plates Pb of 80 µm are stacked, the entire thickness is 840 µm. This further indicates that the pitch (adjustment amount) to change the entire thickness of the light shielding block 7 can be reduced-by preparing unit plates having more than two kinds of thicknesses, or by adding unit plates having a smaller thickness. On the other hand, the number of unit plates required to form one light shielding block 7 can also be reduced by preparing unit plates having a relatively large thickness, thereby simplifying the work of stacking unit plates described later. For example, a light shielding block 7 having the same thickness of 840 µm as that of the above-described example can be formed by preparing unit plates each having a thickness of 380 µm, and stacking 2 (two) of the 380 µm thick unit plates with 1 (one) unit plate having a thickness of 80 µm.

Figure 3A:
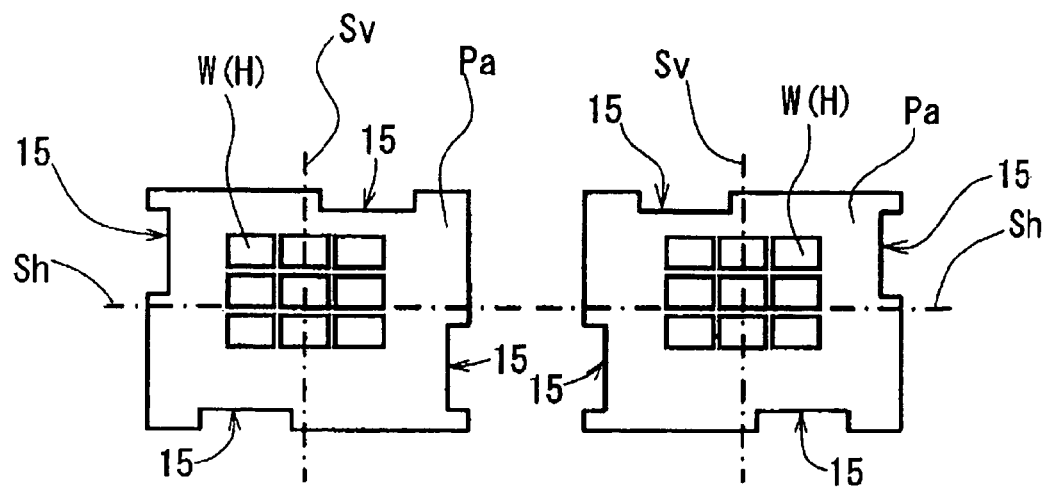
FIG. 3A is a schematic plan view showing an upper surface, on the left, and a lower surface, on the right, of a unit plate usable to form a light shielding block of the compound-eye imaging device, and having windows provided symmetrically left and right.

Referring now to FIG. 3A, a specific example of a unit plate Pa (Pb) to be used in the present embodiment will be described. FIG. 3A is a schematic plan view showing an upper surface, on the left, and a lower surface, on the right, of a unit plate Pa usable to form a light shielding block 7 of the compound-eye imaging device 1, and having windows W provided at a central portion thereof symmetrically left and right as well as notches 15 provided in side ends thereof to form recesses in which an adhesive is to be filled in a later-described assembly process. The view on the right in FIG. 3A is left-right reversed from that on the left. Note that drawing of circular positioning through-holes for positioning pins 100 to pass through is omitted in FIG. 3A. Also note that the following description is directed to a unit plate Pa, but is similarly applicable to a unit plate Pb, because they have the same shape in plan view although they have different thicknesses.

As shown in FIG. 3A, the windows W are formed at a central portion of the unit plate Pa, such that the windows W are positioned symmetrically left and right with respect to a longitudinal (up and down) center line Sv passing through the center of the unit plate Pa and dividing the windows W symmetrically left and right. Thus, even if unit plates Pa each with an upper surface facing upward and unit plates Pa each with a lower surface facing upward are alternately stacked, the positions of the windows W do not change, so that the tubular apertures H are formed also in this case, which pass through the light shielding block 7 after formed by stacking a predetermined number of unit plate Pa. As will be described later, these unit plates Pa (as well as unit plates Pb) are actually stacked in this manner, namely, that the unit plates Pa (as well as unit plates Pb) are reversed alternately upside down and downside up.

Figure 5:
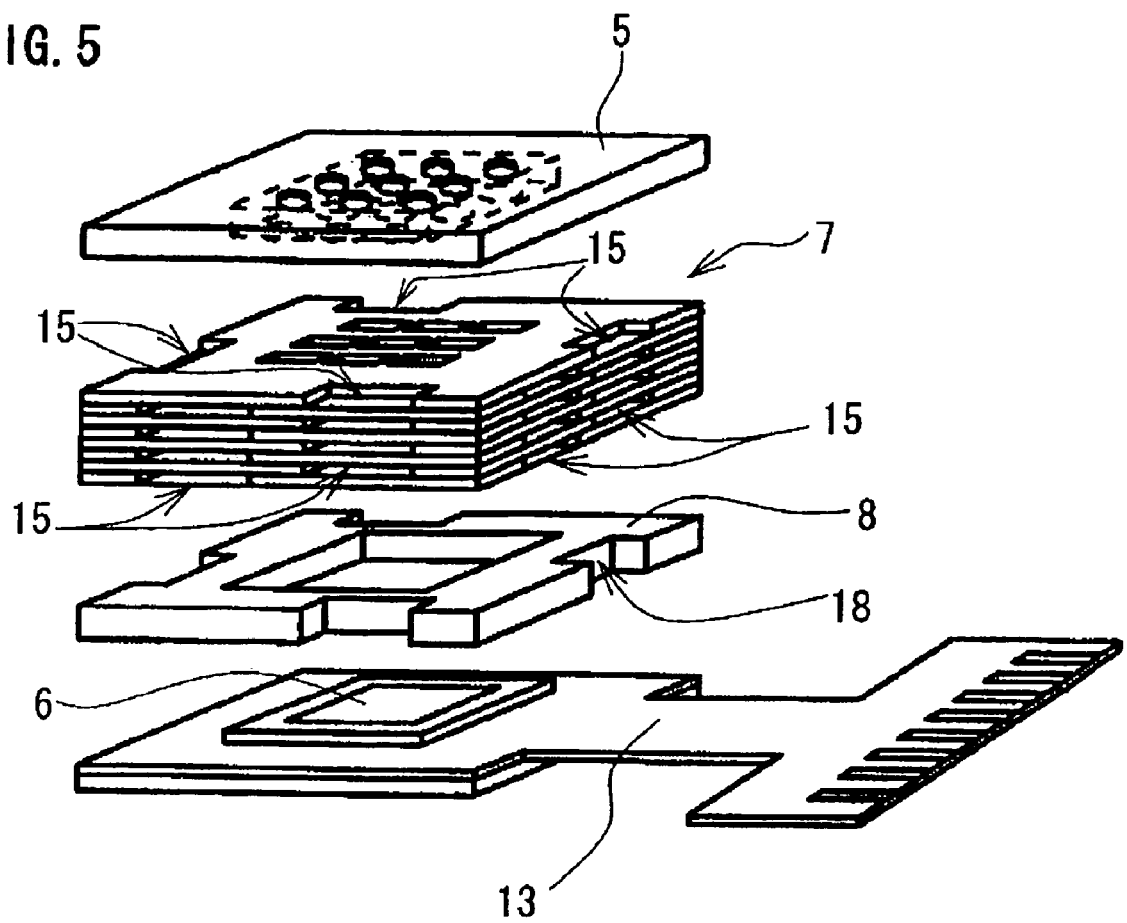
FIG. 5 is a schematic exploded perspective view of a compound-eye imaging device corresponding to FIG. 1, showing notches of a spacer frame and notches of the light shielding block to fill an adhesive.

Each of the unit plates Pa has a notch 15 formed in and extending along a side end thereof in each of four quadrants defined by the longitudinal center line Sv and a lateral (left and right) center line Sh, so that when the unit plates Pa with an upper surface facing upward and the unit plates Pa with a lower surface facing upward are alternately stacked, the notches (or recesses) 15 are positioned alternately left and right and also alternately up and down as shown in FIG. 5 described later. In other words, the positions of the notches or recesses 15 in adjacent unit plates are alternately staggered, or alternated left and right and up and down, when the unit plates Pa with an upper surface facing upward and the unit plates Pa with a lower surface facing upward are alternately stacked.

More specifically, as shown on the left of FIG. 3A, a notch 15 is formed in the left side of the unit plate Pa above the lateral center line Sh, and further formed in the right side of the unit plate Pa below the lateral center line Sh. In addition, a notch 15 is formed in the upper side of the unit plate Pa right of the longitudinal center line Sv, and further formed in the lower side of the unit plate Pa left of the longitudinal center line Sv. On the other hand, the four notches 15 in the four sides of the unit plate Pa shown on the right of FIG. 3A, which is reversed left-right from the unit plate Pa shown on the left of FIG. 3A, are positioned symmetrically to those shown on the left of FIG. 3A with respect to the lateral and longitudinal center lines Sh and Sv, respectively.

Figure 3B:
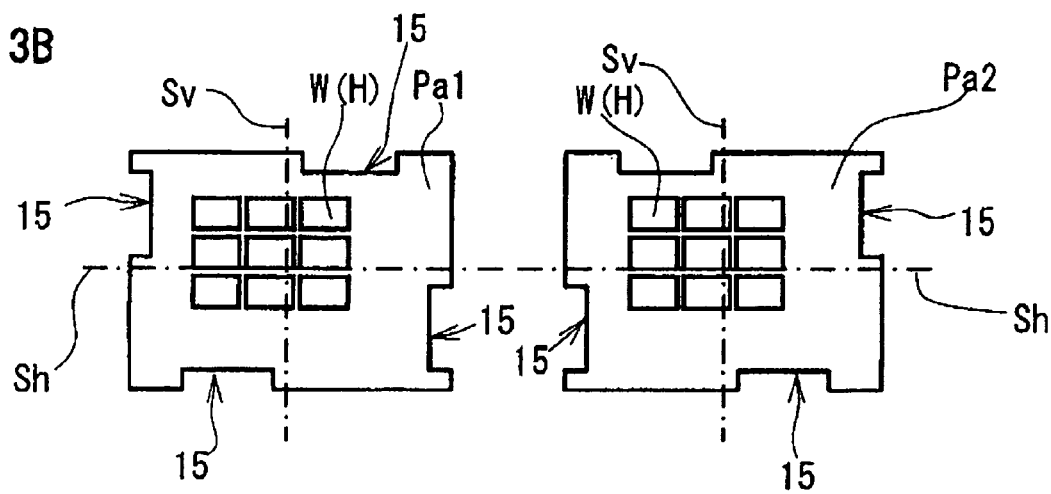
FIG. 3B is a schematic plan view showing, on the left, an upper surface of a unit plate having windows provided asymmetrically left and right and also asymmetrically up and down, while showing, on the right, an upper surface of a unit plate having windows provided to be aligned with the windows in the unit plate on the left in FIG. 3B.
Figure 4:
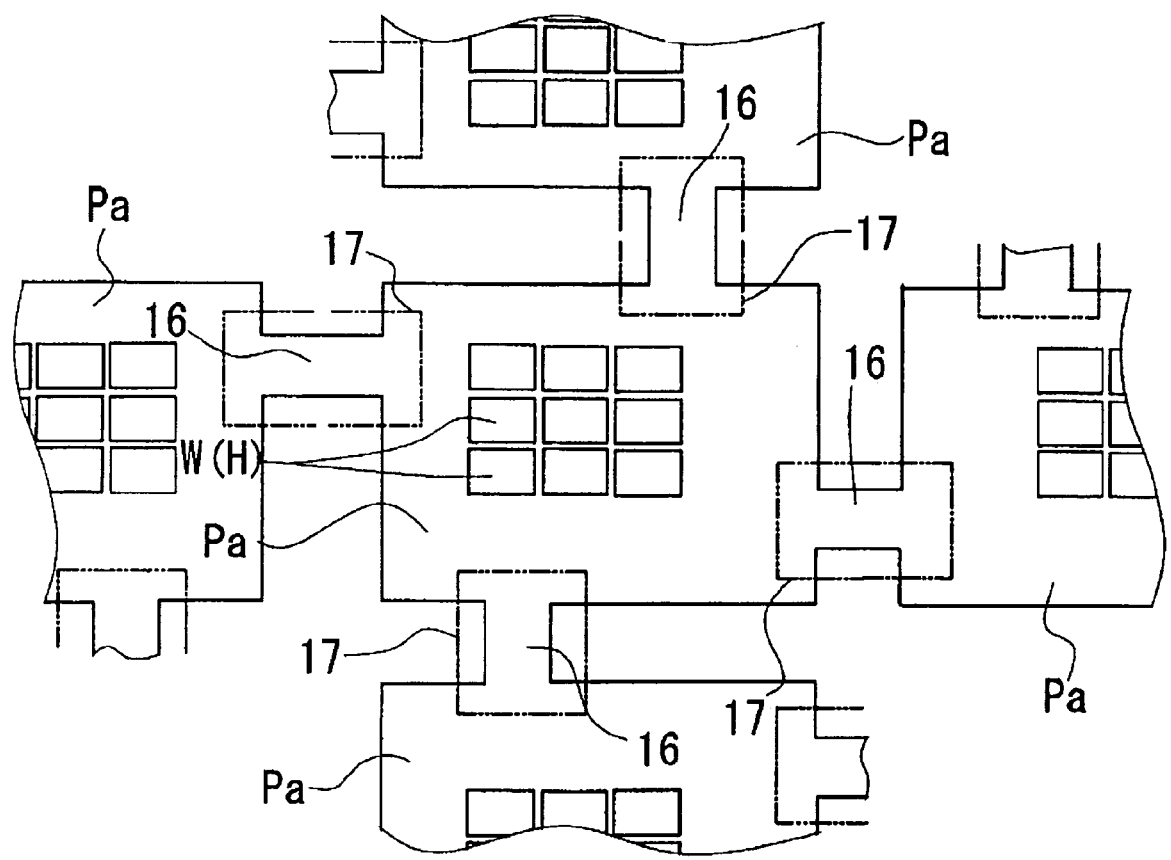
FIG. 4 is a schematic plan view of a portion of a large patterned material plate showing a unit plate therein connected to adjacent unit plates by connecting portions.

The notches 15 can be formed in an appropriate manner. For example, a large material plate patterned to have many unit plates Pa aligned therein is prepared. Thereafter, a punching die is used to provide punching areas for punching and separating the patterned material plate into unit plates Pa. By appropriately designing the position and shape of each punching area, the notches 15 can be formed by the punching itself. This will be described with reference to FIG. 4, which is a schematic plan view of a portion of a large patterned material plate showing a unit plate Pa therein connected to adjacent unit plates Pa by connecting portions 16. As shown in FIG. 4, the connecting portions 16, which can be referred to as suspensions, connect adjacent unit plates Pa in a large patterned material plate prior to punching. By subjecting the patterned material plate to punching using a punching die so as to provide punching areas 17 each having a predetermined shape at a predetermined position relative to the patterned material plate, the patterned material plate can be cut into unit plates Pa with the notches 15 as shown in FIG. 3A or FIG. 3B being formed at the same time.

Next, assembling of the lens holder 5, light shielding block 7, spacer frame 8 and flexible board 13 with the photodetector array 6 mounted thereon will be described with reference to FIG. 1 and FIG. 5. FIG. 5 is a schematic exploded perspective view of the compound-eye imaging device 1 corresponding to FIG. 1, in which, however, drawing of the circular positioning through-holes 5a, 7a, 8a and 13b of the lens holder 5, light shielding block 7, spacer frame 8 and flexible board 13 is omitted, while notches 18 of the spacer frame 8 and the notches 15 of the light shielding block 7 to fill an adhesive are shown. More specifically, as shown in FIG. 5, a notch 18 is formed in each of the four sides of the spacer frame 8 similarly as in each unit plate Pa, except that all the notches 18 are located so as not to face or be aligned with, or so as to be staggered from, the notches 15 of the lowermost unit plate Pa in the light shielding block 7.

As shown in FIG. 1, the flexible board 13, spacer frame 8, light shielding block 7 and lens holder S are inserted in this order into the positioning pins 100 which are separately prepared. The light shielding block 7 is formed of total 8 (eight) stacked unit plates Pa and Pb (for example, 6 unit plates Pa and 2 unit plates Pb) in the above-described manner, i.e., that the total 8 unit plates Pa and Pb are stacked so as to be alternately reversed upside down and downside up. These flexible board 13, spacer frame 8, light shielding block 7 and lens holder 5 are thus positioned by being inserted in the positioning pins 100 so as to allow lights emitted from the optical lenses 2 to form an image accurately on the photodetector array 6 through the apertures (through-holes) H.

Subsequently, an adhesive is filled in the notches (recesses) 15 (refer to FIG. 5) provided in each side surface of the light shielding block 7 and in the notches 18 (also refer to FIG. 5) in each side surface of the spacer frame 8 so as to fix the flexible board 13, spacer frame 8, light shielding block 7 and lens holder 5 together into substantially one body. Thereafter, the positioning pins 100 are removed from the flexible board 13, spacer frame 8, light shielding block 7 and lens holder 5. The filling of the adhesive is done manually using tools such as a dispenser.

More specifically, the adhesive filled in the notches 15 in the side surfaces of the light shielding block 7, or the side surfaces of the unit plates Pa and Pb, bonds the unit plates Pa together, the unit plates Pb together as well as the unit plate Pa (uppermost) and unit plate Pb (lowermost) together which are in contact with each other, so as to bond the entire light shielding block 7 together. This is done using the feature that the positions of the notches 15 in each side of the light shielding block 7 are alternately staggered, or alternated left and right and up and down, as seen in each side view. On the other hand, the adhesive filled in the notches 15 of the uppermost unit plate Pb in the light shielding block 7 adheres to the lower surface of the lens holder 5 so as to bond the light shielding block 7 and the lens holder 5 together. Furthermore, the adhesive filled in the notches 18 of the spacer frame 8 adheres to the lower surface of the lowermost unit plate Pa in the light shielding block 7 and to the upper surface of the flexible board 13 so as to bond the light shielding block 7, spacer free 8 and flexible board 13 together.

In this way, the compound-eye imaging device 1 is assembled. The compound-eye imaging device 1 according to the present embodiment is advantageous in that it is easy to make adjustments for design changes or corrections by increasing or decreasing the number of unit plates Pa and Pb which form the light shielding block 7. Such changes and corrections include: changes or variations in focal length of the optical lenses 2; and corrections of inconsistency between the focal length of the optical lenses 2 and the thickness of the light shielding block 7 (depth of the apertures or through-holes H) if images reproduced by the compound-eye imaging device 1, after assembled, is insufficient in sharpness, and if the insufficient sharpness is presumably caused by such inconsistency.

The foregoing description uses unit plates Pa and Pb as representatively shown in FIG. 3A for the compound-eye imaging device 1, in which each unit plate Pa (Pb) has windows W formed symmetrically with respect to the longitudinal center line Sv. Accordingly, recesses (notches) 15 to fill an adhesive, which are staggered alternately in each side of the light shielding block 7, can be formed simply by using multiple unit plates Pa and Pb having the same shape and by stacking them alternately upside down and downside up. On the other hand, FIG. 3B shows another example of unit plates Pa (Pb) usable for the compound-eye imaging device 1 as described below.

FIG. 3B is a schematic plan view showing, on the left, an upper surface of a unit plate Pa1 having windows W provided asymmetrically left and right and also asymmetrically up and down as well as notches 15 provided in side ends thereof to form recesses to fill an adhesive in an assembly process, while showing, on the right, an upper surface of a unit plate Pa2 having windows W provided to be aligned with the windows W in the unit plate Pa1 as well as notches 15 provided in side ends thereof at positions not to face or be aligned with, or to be staggered from, the notches 15 of the unit plate Pa1 when the unit plates Pa1 and Pa2 are stacked with each other to form a light shielding block 7.

As shown in FIG. 3B, two kinds of unit plates Pa1, Pa2 having notches 15 at positions staggered (left-right and up-down) from those of each other are required as unit plates Pa having the same thickness, when the unit plates Pa have windows W at positions which are neither formed symmetrically left and right with respect to a longitudinal center line Sv, nor formed symmetrically up and down with respect to a lateral center line Sh. Note that the description here is directed to the unit plate Pa1 and Pa2 having the same thickness, but is similarly applicable to unit plates Pb1 and Pb2 for unit plates Pb having the same thickness, because the unit plates Pb1 and Pb2 are the same as (i.e. have the same shapes in plan view as those of) the unit plates Pa1 and Pa2, respectively, except that the thickness of the unit plates Pb1 and Pb2 is different from that of the unit plates Pa1 and Pa2.

More specifically, the unit plate Pa1 shown on the left in FIG. 3B has a notch 15 formed in the left side thereof above the lateral center line Sh and a notch 15 formed in the right side thereof below the lateral center line Sh, while having a notch 15 formed in the upper side thereof right of the longitudinal center line Sv and a notch 15 formed in the lower side thereof left of the longitudinal center line Sv. On the other hand, the unit plate Pa2 shown on the right in FIG. 3B has a notch 15 formed in the left side thereof below the lateral center line Sh and a notch 15 formed in the right side thereof above the lateral center line Sh, while having a notch 15 formed in the upper side thereof left of the longitudinal center line Sv and a notch 15 formed in the lower side thereof right of the longitudinal center line Sv. Accordingly, when the unit plates Pa1 and Pa2 are alternately stacked on each other with the windows W being aligned with each other (without upside down reversal), the notches 15 provided in the sides of the unit plates Pa1 and Pa2 do not face and are not aligned with each other. More specifically, the positions of the notches (recesses) 15 in adjacent unit plates Pa1 and Pa2 are alternately staggered, or alternated left and right and up and down in the four sides of the resultant stacked body.

Next, modified unit plates eliminating the need for notches 15 will be described with reference to FIG. 6A and FIG. 6B. The notches 15 for filling an adhesive in the sides of the above-described unit plates Pa (Pb) shown in FIG. 3A and FIG. 3B can be omitted by changing the shape of each positioning through-hole for each positioning pin 100 to pass through. First, FIG. 6A is a schematic plan view showing an upper surface, on the left, and a lower surface, on the right, of a unit plate Pa usable to form a light shielding block 7 of the compound-eye imaging device 1, and having windows W provided at a central portion thereof symmetrically left and right as well as having rectangular holes 21 for positioning pins 100 to pass through. The view on the right in FIG. 6A is left-right reversed from that on the left. Note that the following description is directed to the unit plate Pa, but is similarly applicable to a unit plate Pb, because they are the same (i.e. have the same shape in plan view), except that they are different in thickness.

Using the drawing on the left in FIG. 6A, the unit plate Pa will be described. The unit plate Pa has formed therein four rectangular holes 21 to allow four positioning pins 100 to pass through (each of the four dashed circles representing the position of each positioning pin 100). The four rectangular holes 21 respectively have longitudinally and laterally extending rectangular shapes and are respectively located at four corners in four areas defined by the longitudinal center line Sv and the lateral center line Sh. More specifically, as shown on the left in FIG. 6A, the unit plate Pa has formed therein longitudinally extending rectangular holes 21 in the upper left and lower right areas thereof and laterally extending rectangular holes 21 in the lower left and upper right areas thereof. An adhesive is filled in the rectangular holes 21 at each of the four corners to bond them together after the unit plates Pa are stacked with each other, and the positions of the unit plates Pa are positioned by the positioning pins 100.

This alternate orientation of the rectangular holes 21 in the respective four areas results in that when unit plates Pa each with an upper surface facing upward and unit plates Pa each with a lower surface facing upward are alternately stacked, the rectangular holes 21 in each of the four areas are aligned with each other with respect to the central axis (center of each dashed circle for each positioning pin 100 in each rectangular hole 21 in FIG. 6A), while the orientations of the rectangular holes 21 in each of the four areas of the alternately stacked unit plates Pa are alternated between longitudinal and lateral orientations (extensions). The alternate longitudinally and laterally extending rectangular holes 21 in each of the four areas in the stacked unit plates Pa thus define a continuous space for inserting each positioning pin 100 and for filling an adhesive, and further make it possible for a lower surface (upper surface) of each unit plate Pa to have an area which contacts an adhesive filled in the rectangular hole 21 of each adjacent lower (upper) unit plate Pa to bond adjacent unit plates Pa.

FIG. 6B is a schematic plan view showing, on the left, an upper surface of a unit plate Pa1 having windows W provided at a portion thereof asymmetrically left and right and also asymmetrically up and down as well as having rectangular holes 21 for positioning pins 100 to pass through, while also showing, on the right, an upper surface of a unit plate Pa2 having windows W provided at a portion thereof asymmetrically left and right and also asymmetrically up and down as well as having rectangular holes 21 to be aligned with the windows W and the rectangular holes 21 in the unit plate Pa1, respectively, when the unit plates Pa1 and Pa2 are stacked with each other to form a light shielding block 7. When the unit plates Pa1 and Pa2 are alternately stacked on each other with the windows W being aligned with each other (without upside down reversal), the orientations of the rectangular holes 21 in each of the four areas of the alternately stacked unit plates Pa1 and Pa2 are alternated between longitudinal and lateral orientations (extensions), similarly as in FIG. 6A.

More specifically, as shown on the left in FIG. 6B, the unit plate Pa1 has formed therein longitudinally extending rectangular holes 21 in the upper left and lower right areas thereof and laterally extending rectangular holes 21 in the lower left and upper right areas thereof. On the other hand, as shown on the right in FIG. 6B, the unit plate Pa2 has formed therein longitudinally extending rectangular holes 21 in the upper right and lower left areas thereof and laterally extending rectangular holes 21 in the lower right and upper left areas thereof.

Also in this case, when these unit plates Pa1 and Pa2 are stacked with each other, the alternate longitudinally and laterally extending rectangular holes 21 in each of the four areas in the stacked unit plates Pa1 and Pa2 define a continuous space for inserting a positioning pin 100 and for filling an adhesive, and further make it possible for a lower (upper) surface of each of unit plates Pa1 and Pa2 to have an area which contacts an adhesive filled in the rectangular hole 21 of each of adjacent lower (upper) unit plates Pa2 and Pa1 so as to bond adjacent unit plates Pa1 and Pa2. Note also that the description here is directed to the unit plate Pa1 and Pa2 having the same thickness, but is similarly applicable to unit plates Pb1 and Pb2 for unit plates Pb having the same thickness, because the unit plates Pb1 and Pb2 are the same as (i.e. have the same shapes in plan view as those of) the unit plates Pa1 and Pa2, respectively, except that the thickness of the unit plates Pb1 and Pb2 is different from that of the unit plates Pa1 and Pa2.

Figure 7A:
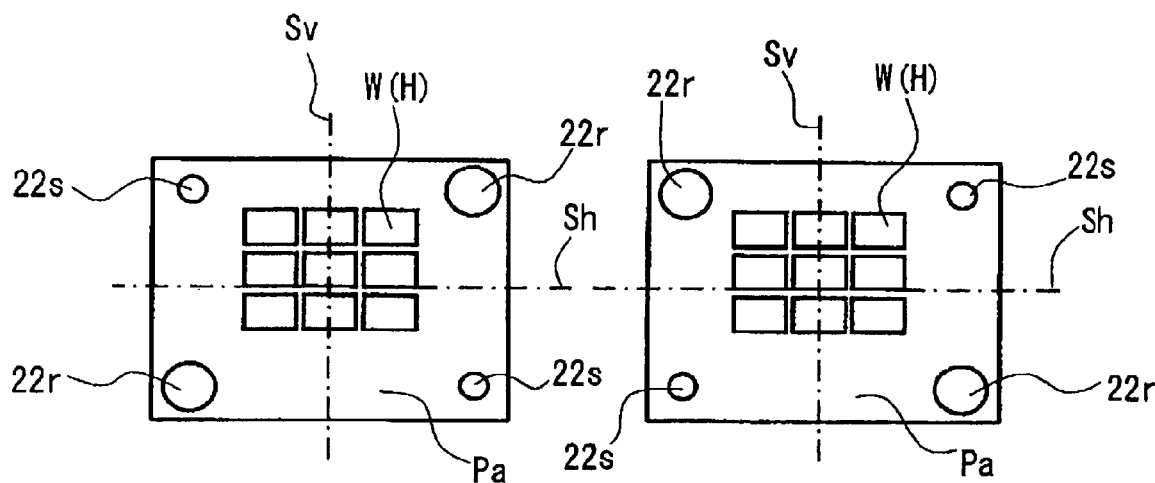

Another modified unit plates eliminating the need for notches 15 will be described with reference to FIG. 7A and FIG. 7B. The notches 15 for filling an adhesive in the sides of the above-described unit plates Pa (Pb) shown in FIG. 3A and FIG. 3B can also be omitted by another change here in the shape of each positioning through-hole for each positioning pin 100 to pass through. First, FIG. 7A is a schematic plan view showing an upper surface, on the left, and a lower surface, on the right, of a unit plate Pa usable to form a light shielding block 7 of the compound-eye imaging device 1, and having windows W provided at a central portion thereof symmetrically left and right as well as having two kinds of circular holes $22r$ and $22s$ with two different diameters for positioning pins 100 to pass through. The view on the right in FIG. 7A is left-right reversed from that on the left. Note that the following description is directed to the unit plate Pa, but is similarly applicable to a unit plate Pb, because they are the same (i.e. have the same shape in plan view), except that they are different in thickness.

Using the drawing on the left in FIG. 7A, the unit plate Pa will be described. The unit plate Pa has formed therein a pair of large diameter circular holes $22r$ and a pair of small diameter circular holes $22s$ to allow four positioning pins 100 to pass through. The circular holes $22r$ and $22s$ in each pair are respectively located at two diagonal corners in two of four areas defined by the longitudinal center line Sv and the lateral center line Sh. When unit plates Pa each with an upper surface facing upward and unit plates Pa each with a lower surface facing upward are alternately stacked with the positions of the unit plates Pa being positioned by the positioning pins 100, alternate two different-sized circular holes $22r$ and $22s$ are aligned with each other with respect to the central axis at each of the four corners so as to form a light shielding block 7.

An adhesive is filled in the alternate circular holes $22r$ and $22s$ at each of the four corners after the unit plates Pa are stacked with each other. The alternate two different-sized circular holes $22r$ and $22s$ in each of the four areas in the stacked unit plates Pa thus define a continuous space for inserting each positioning pin 100 and for filling an adhesive, and further make it possible for a lower (upper) surface of each unit plate Pa to have an area which contacts an adhesive filled in each circular hole 22r of each adjacent lower (upper) unit plate Pa due to the difference in diameter between adjacent circular holes 22r and 22s to bond adjacent unit plates Pa.

Figure 7B:
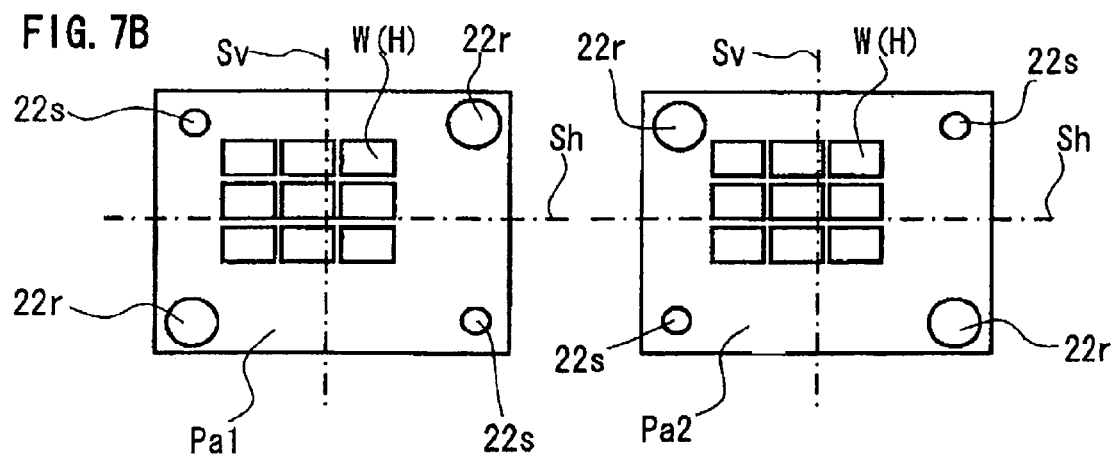

FIG. 7B is a schematic plan view showing, on the left, an upper surface of a unit plate Pa1 having windows W provided at a portion thereof asymmetrically left and right and also asymmetrically up and down as well as having two kinds of circular holes 22r and 22s with two different diameters for positioning pins 100 to pass through, while also showing, on the right, an upper surface of a unit plate Pa2 having windows W provided at a portion thereof asymmetrically left and right and also asymmetrically up and down as well as having two kinds of circular holes 22s and 22r with two different diameters to be aligned with the windows W and the circular holes 22r and 22s in the unit plate Pa1, respectively, when the unit plates Pa1 and Pa2 are stacked with each other to form a light shielding block 7. When the unit plates Pa1 and Pa2 are alternately stacked on each other with the windows W being aligned with each other (without upside down reversal), the two different-sized circular holes 22r and 22s at each of the four corners of the alternately stacked unit plates Pa1 and Pa2 are alternated, similarly as in FIG. 7A.

More specifically, as shown on the left in FIG. 7B, the unit plate Pa1 has formed therein a pair of small diameter circular holes 22s at diagonal corners in the upper left and lower right areas thereof and a pair of large diameter circular holes 22r at diagonal corners in the lower left and upper right areas thereof. On the other hand, as shown on the right in FIG. 7B, the unit plate Pa2 has formed therein a pair of large diameter circular holes 22r at diagonal corners in the upper left and lower right areas thereof and a pair of small diameter circular holes 22s at diagonal corners in the lower left and upper right areas thereof.

Also in this case, when these unit plates Pa1 and Pa2 are stacked with each other, the alternate two different-sizes circular holes 22r and 22s at the diagonal corners in each of the four areas in the stacked unit plates Pa1 and Pa2 define a continuous space for inserting a positioning pin 100 and for filling an adhesive, and further make it possible for a lower (upper) surface of each of unit plates Pa1 and Pa2 to have an area which contacts an adhesive filled in each large diameter circular hole 22r of each of adjacent lower (upper) unit plates Pa2 and Pa1 due to the difference in diameter between adjacent circular holes 22r and 22s so as to bond adjacent unit plates Pa1 and Pa2. Note that the description here is directed to the unit plate Pa1 and Pa2 having the same thickness, but is similarly applicable to unit plates Pb1 and Pb2 for unit plates Pb having the same thickness, because the unit plates Pb1 and Pb2 are the same as (i.e. have the same shapes in plan view as those of) the unit plates Pa1 and Pa2, respectively, except that the thickness of the unit plates Pb1 and Pb2 is different from that of the unit plates Pa1 and Pa2.

In both cases shown in and described with reference to FIGS. 6A, 6B and FIGS. 7A, 7B, the modified unit plates Pa (Pa1 and Pa2) have holes for inserting positioning pins 100 and for filling an adhesive in order to stack the unit plates Pa (Pa1 and Pa2) to form a light shielding block 7. To do so, the unit plates Pa (Pa1 and Pa2) are stacked with the positioning pins 100 being inserted in the holes, and the stack is sandwiched between, and compressed by, appropriate tools so as to be fixed. Subsequently, the positioning pins 100 are removed from the stack, and thereafter an adhesive is filled in the holes to bond the stack or the stacked unit plates Pa (Pa1 and Pa2) together.

As apparent from the foregoing, in any example described above, the light shielding block 7 is formed of stacked multiple flat unit, plates Pa and Pb (Pa1, Pa2 and Pb1, Pb2). Accordingly, it is easy to manufacture a light shielding block 7 with a dense structure in which, for example, distances between adjacent apertures H (windows W) in directions perpendicular to the optical axes L of the optical lenses 2 are small. It is also easy to adapt to changes or variations of focal lengths of the optical lenses 2, if any, by increasing or decreasing the number of unit plates Pa and Pb (Pa1, Pa2 and Pb1, Pb2) to be stacked, making it possible to obtain reproduced images with high sharpness.

It is to be noted that the present invention is not limited to the above embodiments, and various modifications are possible within the spirit and scope of the present invention. For example, the above description has shown certain examples in which the light shielding block 7 is formed of two kinds of unit plates Pa and Pb (Pa1, Pa2 and Pb1, Pb2) having two different thicknesses. However, in the compound-eye imaging device according to any embodiment of the present invention which uses unit plates having different thicknesses, it is only necessary that the light shielding block 7 is formed of at least two kinds of unit plates having two different thicknesses, respectively. Thus, for example, the light shielding block 7 can be formed of three or more kinds of unit plates having three or more different thicknesses, respectively.

The present invention has been described above using presently preferred embodiments, but such description should not be interpreted as limiting the present invention. Various modifications will become obvious, evident or apparent to those ordinarily skilled in the art, who have read the description. Accordingly, the appended claims should be interpreted to cover all modifications and alterations which fall within the spirit and scope of the present invention.

This application is based on Japanese patent application 2005-373998 filed Dec. 27, 2005, the content of which is hereby incorporated by reference.

What is claimed is:

1. A compound-eye imaging device comprising:
    an optical lens array with multiple integrated optical lenses;
    a photodetector array placed at a predetermined distance from the optical lens array for imaging images formed by the optical lenses, respectively; and
    a light shielding block placed between the optical lens array and the photodetector array for partitioning a space between the optical lens array and the photodetector array into a matrix of spaces as seen on a plane perpendicular to the optical axis of each optical lens to prevent lights emitted from the optical lenses from interfering each other,
    wherein the light shielding block is formed of multiple flat unit plates which are stacked in direct contact with each other between the optical lens array and the photodetector array and which have windows to form tubular apertures to pass lights emitted from the optical lenses.

2. The compound-eye imaging device according to claim 1, wherein the multiple unit plates to form the light shielding block comprise at least two kinds of unit plates having different thicknesses.

3. The compound-eye imaging device according to claim 2, wherein each of the stacked unit plates has notches at positions in sides thereof, wherein the positions in the sides of each of the stacked unit plates are staggered from those of each adjacent one of the stacked unit plates, and wherein an adhesive is filled in the notches of the stacked unit plates to bond the unit plates together.

4. The compound-eye imaging device according to claim 1, wherein each of the stacked unit plates has notches at positions in sides thereof, wherein the positions in the sides of each of the stacked unit plates are staggered from those of each adjacent one of the stacked unit plates, and wherein an adhesive is filled in the notches of the stacked unit plates to bond the unit plates together.

5. The compound-eye imaging device according to claim 4, further comprising a lens holder for holding the optical lens array, wherein the light shielding block and the lens holder are bonded together by the adhesive.

6. The compound-eye imaging device according to claim 4, further comprising a spacer frame disposed between the light shielding block and the photodetector array, wherein the light shielding block and the spacer frame are bonded together by the adhesive.

7. The compound-eye imaging device according to claim 6, wherein the multiple unit plates are stacked between the optical lens array and the photodetector array in order to correct inconsistency between focal length of the optical lenses and depth of the apertures.

8. The compound-eye imaging device according to claim 5, wherein the multiple unit plates are stacked between the optical lens array and the photodetector array in order to correct inconsistency between focal length of the optical lenses and depth of the apertures.

9. The compound-eye imaging device according to claim 4, wherein the multiple unit plates are stacked between the optical lens array and the photodetector array in order to correct inconsistency between focal length of the optical lenses and depth of the apertures.

10. The compound-eye imaging device according to claim 3, wherein the multiple unit plates are stacked between the optical lens array and the photodetector array in order to correct inconsistency between focal length of the optical lenses and depth of the apertures.

11. The compound-eye imaging device according to claim 2, wherein the multiple unit plates are stacked between the optical lens array and the photodetector array in order to correct inconsistency between focal length of the optical lenses and depth of the apertures.

12. The compound-eye imaging device according to claim 1, wherein the multiple unit plates are stacked between the optical lens array and the photodetector array in order to correct inconsistency between focal length of the optical lenses and depth of the apertures.

\* \* \* \* \*